US010623867B2

(12) United States Patent
Evans et al.

(10) Patent No.: US 10,623,867 B2
(45) Date of Patent: Apr. 14, 2020

(54) COMBINED AMBIENT PRESSURE AND ACOUSTIC MEMS SENSOR

(71) Applicant: Apple Inc., Cupertino, CA (US)

(72) Inventors: Neal D. Evans, Sunnyvale, CA (US); Janhavi S. Agashe, San Jose, CA (US); Gregory B. Arndt, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/921,588

(22) Filed: Mar. 14, 2018

(65) Prior Publication Data

US 2018/0317022 A1    Nov. 1, 2018

Related U.S. Application Data

(60) Provisional application No. 62/492,821, filed on May 1, 2017.

(51) Int. Cl.
*H04R 19/04* (2006.01)
*H04R 17/00* (2006.01)
(Continued)

(52) U.S. Cl.
CPC ............ *H04R 19/04* (2013.01); *B81B 7/02* (2013.01); *B81C 1/00158* (2013.01);
(Continued)

(58) Field of Classification Search
CPC ...... H04R 19/04; H04R 19/016; H04R 17/00; H04R 17/02; H04R 21/02; H04R 19/005;
(Continued)

(56) References Cited

U.S. PATENT DOCUMENTS

| 7,239,714 B2 | 7/2007 | de Blok et al. |
| 8,588,435 B2 | 11/2013 | Bominaar-Silkens et al. |

(Continued)

FOREIGN PATENT DOCUMENTS

| CN | 1228837 A | 9/1999 |
| CN | 101344447 A | 1/2009 |

(Continued)

OTHER PUBLICATIONS

Utility Model Patent Evaluation Report dated Feb. 12, 2019 for related Chinese Appln. No. ZL201820612919X 5 Pages.

*Primary Examiner* — Fan S Tsang
*Assistant Examiner* — Angelica M McKinney
(74) *Attorney, Agent, or Firm* — Womble Bond Dickinson (US) LLP

(57) ABSTRACT

A microelectromechanical system (MEMS) ambient pressure and acoustic sensor including an enclosure having an enclosure wall that defines an interior chamber and an acoustic input opening to the interior chamber, a moving structure positioned within the interior chamber and being acoustically coupled to the acoustic input opening. The moving structure having an acoustic sensing portion that is movable in response to an acoustic pressure input and an ambient pressure sensing portion that is movable in response to an ambient pressure input. The sensor further including a circuit electrically coupled to the moving structure and that is operable to determine an acoustic output and an ambient pressure output based on a movement of the moving structure.

25 Claims, 4 Drawing Sheets

(51) Int. Cl.

| | | |
|---|---|---|
| *H04R 19/00* | (2006.01) | |
| *B81B 7/02* | (2006.01) | |
| *G01L 9/00* | (2006.01) | |
| *G01L 9/08* | (2006.01) | |
| *H04R 17/02* | (2006.01) | |
| *B81C 1/00* | (2006.01) | |
| *G01L 19/00* | (2006.01) | |
| *H04R 1/02* | (2006.01) | |

(52) U.S. Cl.
CPC .......... *G01L 9/0001* (2013.01); *G01L 9/0089* (2013.01); *G01L 9/08* (2013.01); *G01L 19/0092* (2013.01); *H04R 17/00* (2013.01); *H04R 17/02* (2013.01); *H04R 19/005* (2013.01); *B81B 2201/0257* (2013.01); *B81B 2201/0264* (2013.01); *B81B 2203/0127* (2013.01); *B81B 2207/012* (2013.01); *B81C 2203/036* (2013.01); *B81C 2203/037* (2013.01); *H04R 1/021* (2013.01); *H04R 2201/003* (2013.01)

(58) Field of Classification Search
CPC .................. H04R 1/08; H04R 2201/003; H04R 2207/00; H04R 31/00; B81B 2201/0257; B81B 2201/0264; B81B 2201/003; B81B 2203/0127; B81B 2207/012; B81B 2207/015; B81B 3/0021; B81B 7/02; G01L 9/0089; G01L 9/08; G01L 19/141
See application file for complete search history.

(56) References Cited

U.S. PATENT DOCUMENTS

| | | | |
|---|---|---|---|
| 8,833,171 B2 | 9/2014 | Besling et al. | |
| 9,309,105 B2* | 4/2016 | Dehe | G01L 1/14 |
| 9,469,527 B2 | 10/2016 | Cheng et al. | |
| 10,153,409 B2* | 12/2018 | Cummings | H01L 33/54 |
| 2007/0279726 A1* | 12/2007 | Kato | G02B 26/085 |
| | | | 359/224.1 |
| 2015/0001647 A1* | 1/2015 | Dehe | B81B 3/0021 |
| | | | 257/416 |
| 2015/0158722 A1* | 6/2015 | Lim | B81B 7/02 |
| | | | 257/416 |
| 2015/0256913 A1* | 9/2015 | Dehe | H04R 1/08 |
| | | | 381/176 |
| 2015/0281818 A1* | 10/2015 | Dollen | H04R 19/005 |
| | | | 381/111 |
| 2015/0321906 A1* | 11/2015 | Tsai | B81C 1/0023 |
| | | | 257/416 |
| 2017/0230758 A1* | 8/2017 | Kuntzman | H04R 19/04 |
| 2017/0309799 A1* | 10/2017 | Cummings | H01L 25/0753 |

FOREIGN PATENT DOCUMENTS

| | | |
|---|---|---|
| CN | 202150936 U | 2/2012 |
| CN | 203748005 U | 7/2014 |
| WO | WO2004065926 A1 | 8/2004 |

* cited by examiner

COMBINED AMBIENT PRESSURE AND ACOUSTIC MEMS SENSOR

CROSS-REFERENCE TO RELATED APPLICATION

This application claims the benefit of the earlier filing date of U.S. Provisional Patent Application No. 62/492,821, filed May 1, 2017 and incorporated herein by reference.

FIELD

Embodiments of the invention relate to a sensor for ambient pressure and acoustic sensing; and more specifically, to a microelectromechanical system (MEMS) sensing element for ambient pressure and acoustic sensing.

BACKGROUND

In modern consumer electronics, portable computing devices such as laptops, notebooks, tablet computers, smart phones and portable timepieces do not have sufficient space to house relatively large transducers (e.g., microphones, speakers or the like) and/or other sensors (e.g., accelerometers, barometric pressure sensors or the like). Thus, the sizes of transducers and sensors used in such devices are becoming more and more compact and decreasing in size. The transducers and sensors, however, perform different functions (e.g., sound pick-up, pressure sensing, etc.), and more than one signal conditioning unit or circuit must typically be incorporated into the device for processing of the different signals. Therefore, a number of different transducers, sensors and/or processing units must typically be incorporated into portable devices, leading to product space and integration challenges that are not solved by reducing the sizes of each of these components individually.

SUMMARY

In one embodiment, the invention relates to a microelectromechanical system (MEMS) sensing element for ambient pressure and acoustic sensing. Representatively, the sensing element may combine aspects of a MEMS microphone used for acoustic sensing and a ambient pressure sensor used for ambient pressure sensing into a single sensing element using a shared MEMS die for both pressure and acoustic sensing. For example, the sensing element may include a moving structure that is designed to move (e.g., vibrate) in response to both low frequency ambient pressure changes (e.g., a pressure differential or fluctuation across the moving structure) for ambient pressure sensing and high frequency acoustic pressure changes for acoustic sensing. More specifically, the moving structure may include a MEMS diaphragm, membrane or other MEMS plate like structure with one or more acoustic sensing portions that move in response to pressure changes corresponding to, or indicative of, an acoustic input (e.g., sound) and one or more pressure sensing portions that move in response to pressure changes corresponding to, or indicative of, an ambient pressure change (e.g., climbing stairs). For example, the changes in ambient pressure (e.g., low frequency pressure changes) will cause the ambient pressure sensing portion of the diaphragm to move. Depending on the configuration of the ambient pressure sensing portion (e.g. resistor or capacitor), this movement can be detected by a change in resistance or capacitance which, in turn, can be used to determine the local measured pressure for pressure sensing. Similarly, in the case of acoustic sensing, small and rapid pressure changes (e.g., high frequency pressure changes) corresponding to, for example, sound, will move the acoustic sensing portion of the diaphragm. This movement may further be detected as, for example, a change in capacitance and used for acoustic sensing. The moving structure is, in turn, electrically connected to a circuit (e.g., an application-specific integrated circuit (ASIC)) for signal conditioning and processing of an electrical signal(s) from the sensor for ambient pressure and acoustic sensing. In this aspect, by optimizing a single MEMS component for both high frequency acoustics and low frequency pressure sensing, a broadband device may be designed to measure acoustic pressure changes superimposed upon a slower changing ambient pressure signal. In addition, since a single sensing element can perform both sensing operations, produce space and integration challenges facing MEMS technologies may be solved.

More specifically, in one embodiment, the invention is directed to a microelectromechanical system (MEMS) ambient pressure and acoustic sensor including an enclosure having an enclosure wall that defines an interior chamber and an acoustic input opening to the interior chamber. The sensor may further include a moving structure positioned within the interior chamber and being acoustically coupled to the acoustic input opening. The moving structure may have an acoustic sensing portion that is movable in response to an acoustic pressure input and an ambient pressure sensing portion that is movable in response to an ambient pressure input. In addition, a circuit may be electrically coupled to the moving structure and may operate to determine an acoustic output (e.g., output an audio signal) and an ambient pressure output (e.g., output a signal indicative of the ambient pressure change) based on a movement of the moving structure. In some embodiments, the acoustic pressure sensing portion is more compliant than the ambient pressure sensing portion. Still further, the acoustic pressure sensing portion may be radially inward to the ambient pressure sensing portion. For example, the acoustic sensing portion may include a substantially solid membrane and the ambient pressure sensing portion may include a plurality of spokes extending radially outward from the substantially solid membrane. In still further embodiments, the acoustic pressure sensing portion may include a compliant member positioned between a first plate and a second plate, and the first plate and the second plate may be fixed with respect to the compliant member. In some embodiments, the ambient pressure sensing portion may include a piezoelectric resistor.

In addition, in some embodiments, the acoustic pressure input may correspond to a pressure change of 100 Pascal or less. In addition, in some cases, the ambient pressure input corresponds to a pressure change that is greater than 100 Kilopascal. In some embodiments, the circuit is operable to determine the acoustic output based on a change in capacitance caused by a movement of the acoustic sensing portion with respect to a fixed back plate within the enclosure. In addition, the circuit may be operable to determine the ambient pressure output based on a change in capacitance caused by a movement of the ambient pressure sensing portion with respect to a fixed back plate within the enclosure. In still further embodiments, the circuit may be operable to determine the ambient pressure output based on a change in resistance of the ambient pressure sensing portion caused by a movement of the ambient pressure sensing portion in response to the ambient pressure input. Still further, the circuit may be operable to filter a signal corresponding to a movement of the moving structure to determine the acoustic output and the ambient pressure output. In addition, the ambient pressure sensing portion may include a first movable plate and the acoustic sensing portion comprises a second movable plate, the first movable plate and the second movable plate share a sealed volume in between, and at least one of the ambient pressure output or the acoustic output is determined based on a change in pressure within the sealed volume.

In other embodiments, the invention is directed to a MEMS ambient pressure and acoustic sensor including an enclosure having an enclosure wall that defines an interior chamber and an acoustic port to the interior chamber. In some embodiments, a moving structure is positioned within the interior chamber and acoustically coupled to the acoustic input opening. The moving structure may have a diaphragm portion and a piezoelectric portion extending radially outward from the diaphragm portion. The diaphragm portion may be movable in response to an acoustic pressure input and the piezoelectric portion may be movable in response to an ambient pressure input. In addition, a circuit may be electrically coupled to the moving structure to detect a movement of the moving structure for acoustic sensing and ambient pressure sensing. In some embodiments, the piezoelectric portion may include a plurality of spokes, and each of the spokes may include a piezoelectric resistor. In this embodiment, pressure sensing may include detecting a change in a resistance of the piezoelectric resistor. In additional embodiments, acoustic sensing may include detecting a change in capacitance caused by a movement of the diaphragm portion with respect to a fixed plate within the enclosure. The acoustic pressure input may correspond to, for example, a pressure change of 50 Millipascal to 100 Pascal. In addition, the ambient pressure input may correspond to a pressure change of 100 Pascal to 110 Kilopascal.

In other embodiments, the invention is directed to a MEMS ambient pressure and acoustic sensor including an enclosure having an enclosure wall that defines an interior chamber and an acoustic input opening to the interior chamber. A moving structure may be positioned within the interior chamber and acoustically coupled to the acoustic input opening. The moving structure may have an acoustic sensing portion and an ambient pressure sensing portion. The acoustic sensing portion may include a compliant member positioned between a first plate and a second plate. The compliant member may be movable with respect to the first plate and the second plate. The ambient pressure sensing portion may extend radially outward from the acoustic sensing portion and be movable with respect to the enclosure. Still further, a circuit may be electrically coupled to the moving structure to detect the acoustic pressure input and the ambient pressure input based on a movement of the moving structure. The compliant member may include a diaphragm that vibrates in response to an acoustic input. In other embodiments, the compliant member may include a deformable polymer that deforms in response to an acoustic input. In addition, the ambient pressure sensing portion may remain in a fixed position when the diaphragm portion moves in response to an acoustic pressure input. In some cases, the diaphragm member is movable in response to a pressure change corresponding to a high frequency input of 20 Hz or more. The piezoelectric portion may be movable in response to a pressure change corresponding to a low frequency input of 10 Hz or less.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments are illustrated by way of example and not by way of limitation in the figures of the accompanying drawings in which like references indicate similar elements. It should be noted that references to "an" or "one" embodiment in this disclosure are not necessarily to the same embodiment, and they mean at least one.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description.

In the following description, reference is made to the accompanying drawings, which illustrate several embodiments of the present invention. It is understood that other embodiments may be utilized, and mechanical compositional, structural, electrical, and operational changes may be made without departing from the spirit and scope of the present disclosure. The following detailed description is not to be taken in a limiting sense, and the scope of the embodiments of the present invention is defined only by the claims of the issued patent.

The terminology used herein is for the purpose of describing particular embodiments only and is not intended to be limiting of the invention. Spatially relative terms, such as "beneath", "below", "lower", "above", "upper", and the like may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (e.g., rotated 90 degrees or at other orientations) and the spatially relative descriptors used herein interpreted accordingly.

As used herein, the singular forms "a", "an", and "the" are intended to include the plural forms as well, unless the context indicates otherwise. It will be further understood that the terms "comprises" and/or "comprising" specify the presence of stated features, steps, operations, elements, and/or components, but do not preclude the presence or addition of one or more other features, steps, operations, elements, components, and/or groups thereof.

The terms "or" and "and/or" as used herein are to be interpreted as inclusive or meaning any one or any combination. Therefore, "A, B or C" or "A, B and/or C" mean "any of the following: A; B; C; A and B; A and C; B and C; A, B and C." An exception to this definition will occur only when a combination of elements, functions, steps or acts are in some way inherently mutually exclusive.

Figure 1:
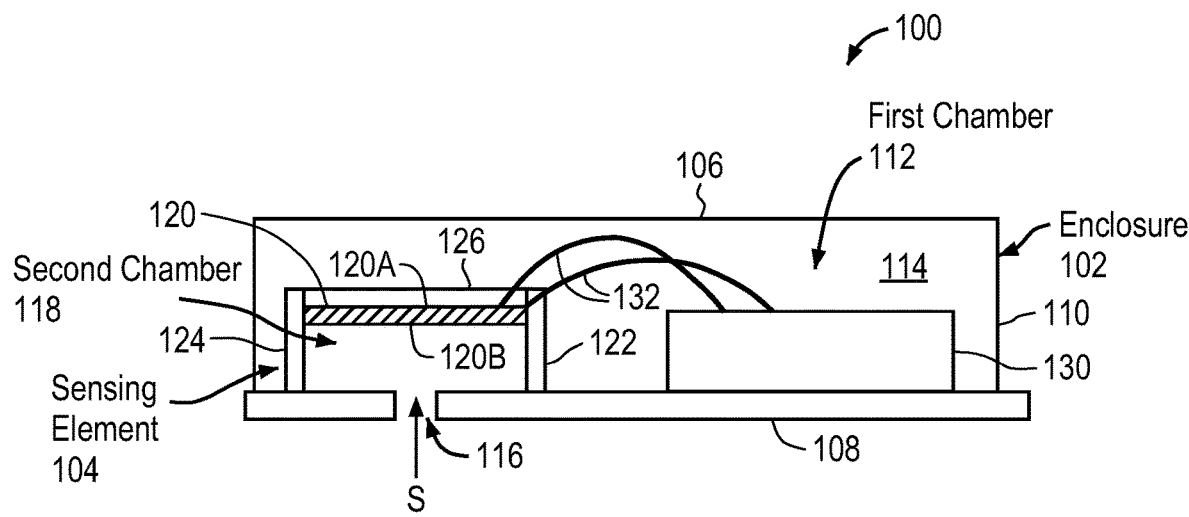
FIG. 1 is a schematic cross-section of one embodiment of a sensor assembly.

FIG. 1 is a schematic cross-section of one embodiment of a sensor module or assembly. Sensor assembly 100 may be a combined ambient pressure and acoustic sensor that includes a sensing element 104 and integrated circuit (IC) 130. Sensing element 104 may be a single sensing unit adapted for both ambient pressure and acoustic sensing, and IC 130 (e.g., an application-specific integrated circuit (ASIC)) may be a single IC chip adapted for both processing and/or filtering of the corresponding signals. In this aspect, multiple functions (e.g., ambient pressure sensing and acoustic sensing) may be performed by a single sensing element and the signals processed by a single IC, thus eliminating the need for multiple devices to perform each of these functions.

Sensing element 104 and IC 130 may be enclosed within an interior chamber or space 114 of an enclosure 102. Enclosure 102 may include a top wall or top side 106, a bottom wall or bottom side 108 and a side wall 110 connecting the top side 106 to the bottom side 108. The combination of the top side 106, bottom side 108 and side wall 110 may define interior chamber or space 114. In some embodiments, one or more of the top side 106, bottom side 108 and/or side wall 110 may be integrally formed with one another as a single unit. In other embodiments, one of the sides may be formed by a substrate having circuitry formed therein (e.g. a printed circuit board). For example, top side 106 and side wall 110 may be one integrally formed structure, for example a lid or cover, that is mounted to bottom side 108, which is formed by a substrate, to form the enclosed space within which the various components of sensor assembly can be positioned. Enclosure 102 may further include an acoustic port 116. Acoustic port 116 may, in some embodiments, be an acoustic inlet port that allows for a sound (S) from the environment surrounding enclosure 102 to be input to sensing element 104 within enclosure 102 (e.g., for sound pick-up by sensing element 104). It should be understood, however, that in other embodiments, acoustic port 116 may be used as an output port, for example, to output sound from sensing element 104 to the ambient or surrounding environment. In FIG. 1, acoustic port 116 is shown formed within bottom side 108 of enclosure 102. In other embodiments, acoustic port 116 may be formed within top side 106 of enclosure 102. In still further embodiments, acoustic port 116 may be formed through side wall 110, or any other portion of enclosure 102 which allows for sound (S) to be input through acoustic port 116 to sensing element 104.

Referring now to sensing element 104 specifically, sensing element 104 may be mounted to bottom side 108 of enclosure 102 such that it is acoustically coupled to, and can receive sound (S) through, acoustic port 116. It should be understood, however, that although not shown, sensing element 104 could be mounted, or otherwise coupled to, any side of enclosure 102 that allows for it to be acoustically coupled, or otherwise in communication with, acoustic port 116. Sensing element 104 may include a moving structure 120 that is suspended over acoustic port 116 by support members 122, 124. In this aspect, moving structure 120 may face, or otherwise share a volume with, acoustic port 116 along a bottom face or side 120B and the top face or side 120A may face, or otherwise share a volume with, interior space 114. Said another way, moving structure 120 may divide interior space 114 into a first chamber 112 and a second chamber 118. First chamber 112 may be considered, for example, a back volume chamber or reference pressure chamber (having a know pressure) that is, in some embodiments, substantially sealed from the ambient environment (or have only a small leak or vent port). Second chamber 118 may, in turn, be considered a front volume chamber that is open to the ambient environment via acoustic port 116 and, in some embodiments, may be acoustically isolated or sealed from first chamber 112.

To accomplish both ambient pressure and acoustic sensing as previously discussed, moving structure 120 is configured to move in response to an acoustic input and an ambient pressure input. For example, in one embodiment, moving structure 120 may include one or more of a MEMS diaphragm, membrane, plate or the like. For example, moving structure 120 may include a diaphragm formed during a MEMS processing operation, or a diaphragm, membrane or plate including a polyester material such as polyethylene naphthalate (PEN), polyurethane (PU) or layers of different materials (e.g., a core layer sandwiched between two aluminum layers). In some cases, portions of the MEMS diaphragm, membrane, plate or the like, may have different compliance characteristics such that some portions are relatively compliant and movable in response an acoustic input (e.g., for sound pick-up) while others are more stiff such that they only move in response to an ambient pressure input (e.g., for pressure sensing). It should be understood that the term "compliant" or "compliance" is intended to refer to a modulus of elasticity of a member or material used to form the member, such that a more compliant member or material means the member or material has a lower modulus of elasticity than a less compliant or "stiff" material. For example, in the case of an acoustic input such as sound (S), the corresponding sound pressure waves may be high frequency or small, rapid pressure changes. Therefore, one portion of moving structure 120 may have a compliance and/or structure that allows for it to move (e.g., vibrate) in response to these small and rapid pressure changes for acoustic sensing and transduction of sound similar to a MEMS microphone. In contrast, the ambient pressure input may, for example, be a relatively large and slow pressure change (e.g., low frequency) such as that caused by movement of the device within which sensing element 104 is implemented (e.g., walking up stairs). Moving structure 120 may therefore also have a portion (e.g., an ambient pressure sensing portion) with a compliance and/or structure that allows for it to move in response to these low frequency pressure changes for ambient pressure sensing. This ambient pressure sensing portion may, however, remain static during the acoustic input such that any signal output corresponding to the movement of this portion (e.g., an ambient pressure output) is specific to an ambient pressure change. In other words, the portion that moves in response to the acoustic input may be considered more compliant, less stiff, or have a lower Young's modulus than, the portion which responds to the ambient pressure input. Additional details regarding the configuration and/or structure of moving structure which allows for both ambient pressure and acoustic sensing will be described in more detail in reference to FIGS. 2-5.

Sensing element 104 may further include an optional back plate 126. Optional back plate 126 may be used to detect a movement of moving structure 104 based on a change in capacitance. Representatively, back plate 126 may be arranged in a parallel and fixed position with respect to moving structure 120. For example, back plate 126 may be connected to support members 122, 124 at a position above or below moving structure 120. In FIG. 1, back plate 126 is shown positioned along the top side 120A of moving structure 120 (e.g., above moving structure 102). In other embodiments, however, back plate 126 may be positioned along bottom side 12B of moving structure 120, or both top side 120A and bottom side 120B. Back plate 126 and moving structure 120 may include conductive surfaces such that they form the plates of a variable capacitor. As the moving structure 120 moves in response to a pressure input (e.g., acoustic pressure change or ambient pressure change), the air gap between the two plates changes, resulting in a capacitance change proportional to the pressure input, which in turn, can be used for acoustic or ambient pressure sensing. It is noted that although back plate 126 is shown in FIG. 1, in some embodiments, back plate 126 may be omitted and a wall of enclosure 102 may be used as a back plate. For example, a portion of top wall 106 which is aligned with, above or otherwise over, moving structure 120 may be used as a back plate for detecting a capacitance change.

Sensing assembly 100 may further include an integrated circuit such as an application-specific integrated circuit (ASIC) 130 positioned within enclosure 102 for processing of a signal (or signals) output by sensing element 104 (e.g., an acoustic output and an ambient pressure output). ASIC 130 may be mounted to bottom side 108 of enclosure 102 and electrically connected to sensing element 104 by wires 132. ASIC 130 may, as previously discussed, be used for signal conditioning and/or processing of ambient pressure and acoustic signals output by sensing element 104 for acoustic sensing and ambient pressure sensing.

Figure 2:
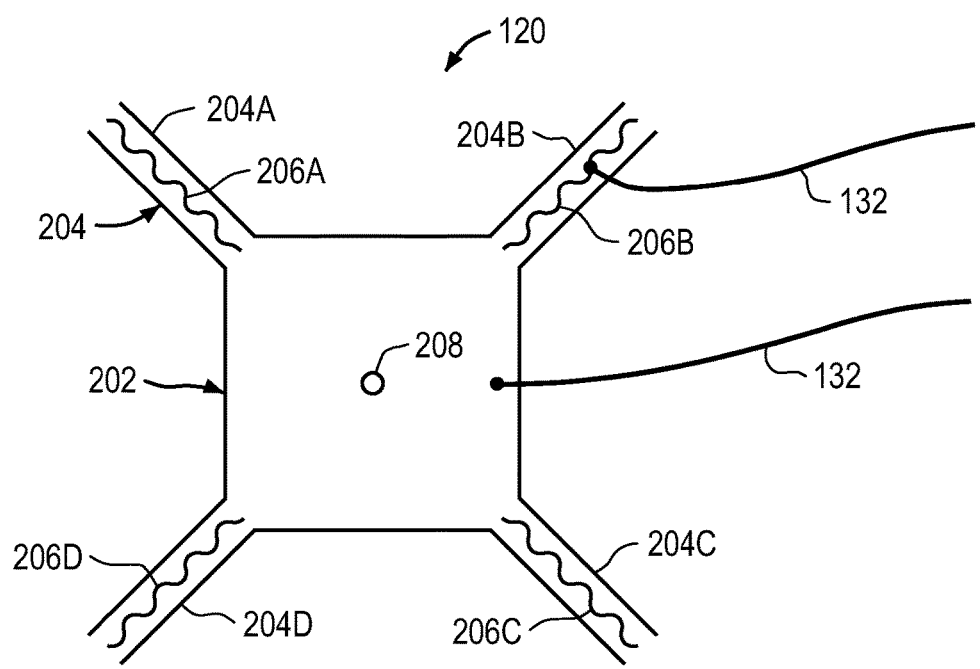
FIG. 2 is a top plan view of one embodiment of a moving structure of the sensor assembly of FIG. 1.

Referring now in more detail to the moving structure, FIG. 2 illustrates a top plan view of one embodiment of the moving structure of FIG. 1. Representatively, from this view, it can be seen that moving structure 120 may include an acoustic sensing portion 202 and an ambient pressure sensing portion 204. Acoustic sensing portion 202 may be, for example, substantially similar to a MEMS diaphragm that may be used in a MEMS microphone, or in some cases a MEMS loudspeaker assembly. Representatively, acoustic sensing portion 202 may be a substantially solid and relatively compliant membrane or plate. In some embodiments, a relatively small pressure or vent port 208 for controlled venting or barometric relief may be included in acoustic sensing portion 202. Acoustic sensing portion 202 may be configured to vibrate, or otherwise move, in response to an acoustic input such as sound (S). In this aspect, acoustic sensing portion 202 may have a compliance such that it will move or vibrate in response to small, rapid pressure changes which are characteristic of a sound input. For example, acoustic sensing portion 202 may have a compliance or modulus of elasticity such that it can move (e.g., vibrate) in response to an acoustic input corresponding to a pressure change of 100 Pascal or less, for example, 50 Millipascal to 100 Pascal. In another example, acoustic sensing portion 202 may have a compliance sufficient to move (e.g., vibrate) in response to a high frequency acoustic input greater than 10 Hz, or 20 Hz or greater.

Ambient pressure sensing portion 204, on the other hand, may be configured to respond to relatively low frequency and/or high pressure changes associated with an ambient pressure change. Representatively, ambient pressure sensing portion 204 may have a compliance and/or structure such that it moves in response to a pressure change of more than 100 Pascal, for example, up to 100 Kilopascal, up to 110 Kilopascal or more, or a pressure change otherwise outside the range to which the acoustic sensing portion 202 is responsive to. In another example, ambient pressure sensing portion 204 may have a compliance and/or structure sufficient to allow it to move in response to a low frequency input of 10 Hertz (Hz) or less, or a frequency otherwise outside the range to which the acoustic sensing portion 202 is responsive to. In other words, ambient pressure sensing portion 204 is considered to be less compliant or stiffer than acoustic sensing portion 202. For example, ambient pressure sensing portion 204 is of a sufficient stiffness or compliance such that it responds to an ambient pressure input (e.g., low frequency and/or high pressure change), but does not respond to an acoustic input (e.g., high frequency and/or low pressure change). In this aspect, the acoustic sensing portion 202 and the ambient pressure sensing portion 204 move in response to different, predetermined, pressure changes and/or frequencies. The corresponding electrical signal output by the different portions can therefore be filtered, or otherwise processed, by the ASIC to determine an acoustic output and an ambient pressure output or measurement using a single moving structure 120.

For example, in some embodiments, the acoustic or ambient pressure output signal may be a change in resistance and/or a change in capacitance due to the movement of the acoustic sensing portion 202 and/or ambient pressure sensing portion 204 that can be used to determine the acoustic and/or ambient pressure. Representatively, in one embodiment, the acoustic sensing portion 202 is part of a variable capacitor such that the movement results in a change in capacitance that can be output as one signal to the ASIC. The movement of the ambient pressure sensing portion 204, on the other hand, can be detected as a change in resistance or capacitance, and the corresponding signal output to the ASIC. This information can then be processed (e.g., filtered) by the ASIC for acoustic and ambient pressure sensing.

For example, for ambient pressure sensing based on a change in resistance of ambient pressure sensing portion 204, ambient pressure sensing portion 204 may include a number of arm or spoke like members 204A, 204B, 204C and 204D which extend radially outward from acoustic sensing portion 202. The arm or spoke like members 204A-204D may further include springs 206A, 206B, 206C and 206D which increase a stiffness of ambient pressure sensing portion 204 with respect to acoustic sensing portion 202, and change in resistance when ambient pressure sensing portion 204 moves. For example, springs 206A-206D may be piezoelectric resistors that are embedded in, or otherwise connected to, extension portions (arm or spoke like members) of the structure (e.g., membrane) that forms the acoustic sensing portion 202. The piezoelectric resistors may act as strain gauges that bend in response to an ambient pressure input, and result in a change in resistance. The change in resistance can then be processed by the ASIC for ambient pressure sensing.

In one illustrative embodiment, acoustic sensing portion 202 outputs a signal to ASIC (see ASIC 130 of FIG. 1) via a wire 132 and ambient pressure sensing portion 204 outputs a signal to ASIC via another wire 132. Each of these signals may, in turn, be filtered and/or processed by the ASIC to provide an acoustic output and/or a measure of the ambient pressure at a given time. In addition, in other embodiments, a signal corresponding to an entire frequency range may be output to the ASIC, and the ASIC may process the signal to determine the ambient pressure (e.g., low frequency output) and the acoustic pick-up (e.g., high frequency output).

Figure 3:
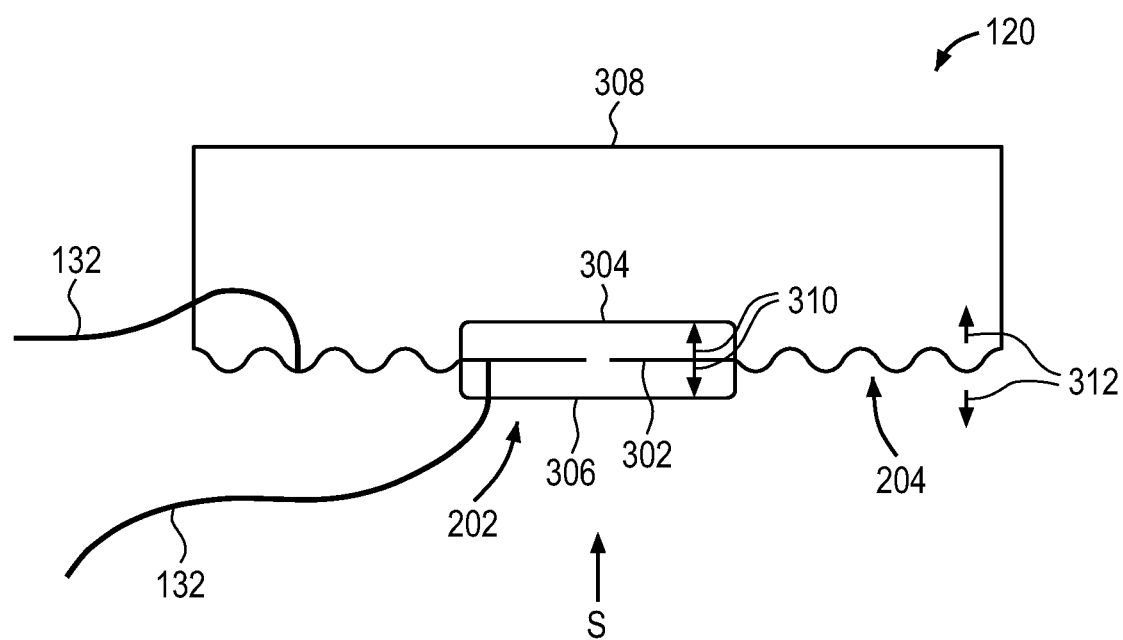
FIG. 3 is a cross-sectional side view of one embodiment of a moving structure of the sensor assembly of FIG. 1.

FIG. 3 illustrates a cross-sectional side view of one embodiment of a moving structure having an acoustic sensing portion and an ambient pressure sensing portion. For example, the moving structure of FIG. 3 may be a cross-sectional view of moving structure 120 previously discussed in reference to FIG. 1 and FIG. 2. Representatively, as previously discussed, moving structure 120 includes acoustic sensing portion 202 and ambient pressure sensing portion 204. From this view, it can be seen that acoustic sensing portion 202 may include a stack up of MEMS diaphragms, membranes and/or plates. For example, acoustic sensing portion 202 may include a compliant member or plate 302 sandwiched between a first reference pressure plate 304 and a second reference pressure plate 306. The first and second reference pressure plates 304, 306 may be fixed with respect to plate 302. Compliant plate 302, however, may move (as shown by arrows 310) with respect to plates 304, 306 in response to an acoustic input (e.g., small and rapid pressure changes) for acoustic sensing, as previously discussed. The change in capacitance due to the movement of compliant plate 302 may therefore be measured with respect to one or both of the fixed first and second reference pressure plates 304, 306. It should further be understood that although both first and second reference pressure plates 304, 306 are disclosed, in some embodiments, only one reference plate may be provided.

In addition, in some embodiments, compliant plate 302 may include a deformable polymer that deforms in response to an acoustic input. The deformable polymer may deform differently in response to an acoustic input versus an ambient pressure input. For example, in response to an ambient pressure input, the deformable polymer may result in the output of a direct current signal (DC) to the ASIC, while outputting an alternating current (AC) signal in response to an acoustic input. These signals can then be processed by the ASIC to determine an acoustic or ambient pressure change. Alternatively, the degree of deformation and/or capacitance change occurring between the deformable polymer and reference pressure plates 304, 306 could be used for acoustic sensing.

Ambient pressure sensing portion 204 may extend radially outward from acoustic sensing portion 202 as shown. In some embodiments, ambient pressure sensing portion 204 may include piezoelectric resistors as previously discussed in reference to FIG. 2 to detect movement. In addition, in some embodiments, a change in capacitance due to the movement of ambient pressure sensing portion 204 in the direction of arrows 312 may be used to detect or measure the ambient pressure. Representatively, the movement of ambient pressure sensing portion 204 with respect to an absolute reference plate 308, which is fixed with respect to ambient pressure sensing portion 204, may result in a change in capacitance between the two plates that can be used for ambient pressure sensing. In some embodiments, absolute reference plate 308 may be a portion of back plate 126 or a portion of top wall 106 of enclosure 102 previously discussed in reference to FIG. 1.

Figure 4:
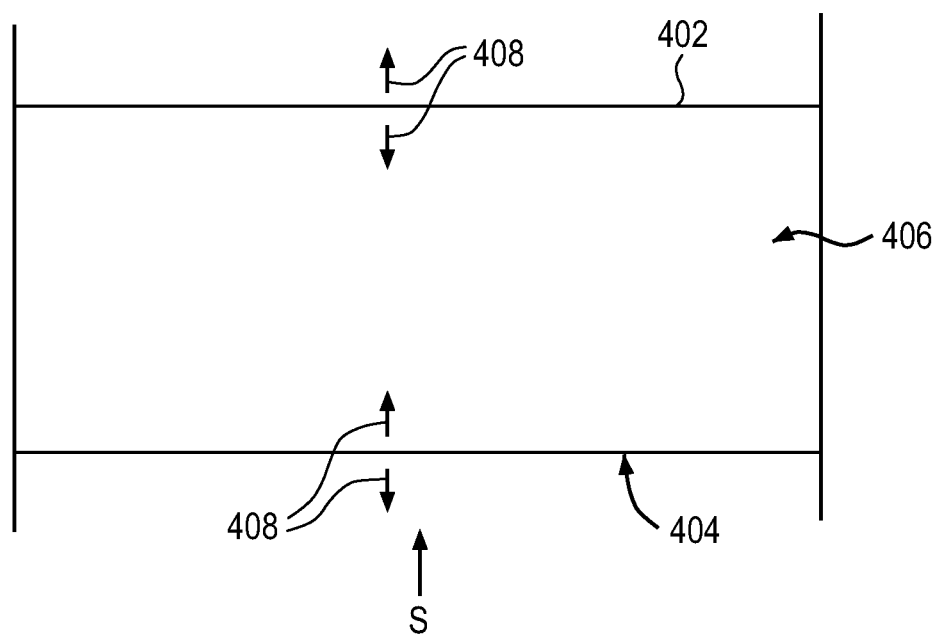
FIG. 4 is a cross-sectional side view of one embodiment of a moving structure of the sensor assembly of FIG. 1.

FIG. 4 illustrates a cross-sectional side view of another embodiment of a moving structure having an acoustic sensing portion and an ambient pressure sensing portion. For example, the moving structure of FIG. 4 may be a cross-sectional view of moving structure 120 previously discussed in reference to FIG. 1. Representatively, moving structure 120 may include an acoustic sensing portion 402 and ambient pressure sensing portion 404 which move in a direction of arrows 408 in response to an acoustic input and/or an ambient pressure input as previously discussed. From this view, it can be seen, however, that acoustic sensing portion 402 is a top MEMS diaphragm, membrane and/or plate, and ambient pressure sensing portion 404 is a bottom MEMS diaphragm, membrane and/or plate. Acoustic sensing portion 402 and ambient pressure sensing portion 404 contain in between the two a sealed volume 406 having a known reference pressure. In this aspect, the greater the pressure change (e.g., an ambient pressure input) the closer portions 402 and 404 move together. Said another way, the degree of movement of portions 402 and 404 is less in response to a lower pressure change (e.g., an acoustic input). In this aspect, the change in pressure within the sealed volume 406 can be used to determine an acoustic or ambient pressure change. Representatively, portions 402, 404 will move closer to together and cause a greater pressure increase within the sealed volume 406 in response to a high pressure change (e.g., ambient pressure change) than a low pressure change (e.g., an acoustic input). Thus, the magnitude or degree of pressure change within sealed volume 406 in comparison to the known reference pressure within sealed volume 406 can be used to distinguish between, and determine, a movement of portions 402, 404 in response to an acoustic input or an ambient pressure input, and be used for acoustic and ambient pressure sensing.

Figure 5:
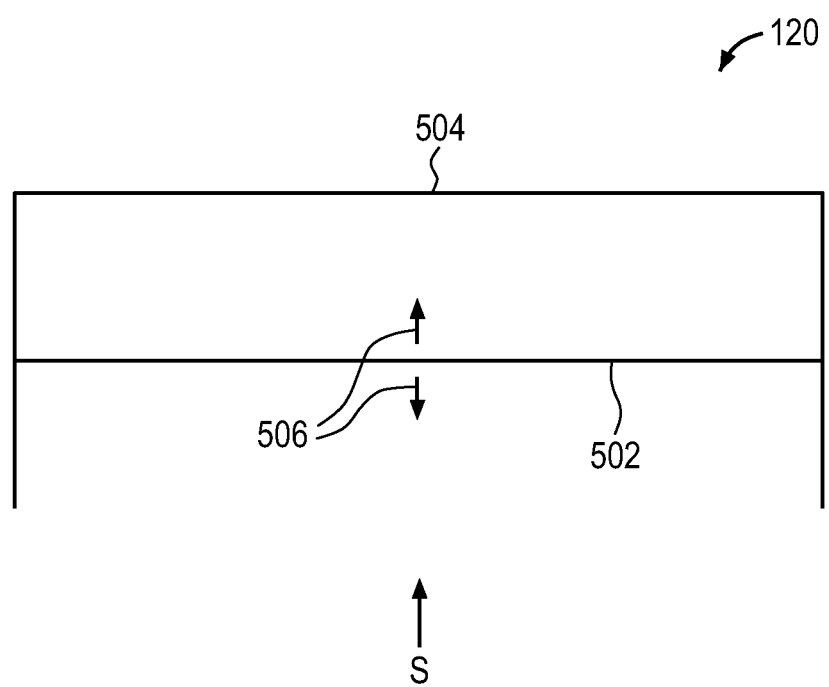
FIG. 5 is a cross-sectional side view of one embodiment of a moving structure of the sensor assembly of FIG. 1.

FIG. 5 illustrates a cross-sectional side view of another embodiment of a moving structure for acoustic and ambient pressure sensing. For example, the moving structure of FIG. 5 may be a cross-sectional view of moving structure 120 previously discussed in reference to FIG. 1. Representatively, in this embodiment, moving structure 120 may include a single membrane or diaphragm 502 in which a vent port or other similar relief port (such as that previously mentioned regarding FIG. 2) is omitted or otherwise closed off. The omission of a vent or relief port in diaphragm 502 allows for the diaphragm to move in a direction of arrows 506 in response to both acoustic (e.g., high frequency input) and ambient pressure inputs (e.g., low frequency input). In other words, diaphragm 502 will move in response to small, rapid pressure changes (e.g., a sound input above 10 Hz) and also move in response to low frequency ambient pressure changes (e.g., an input below 10 Hz). The corresponding entire frequency range detected by the movement can then be output and filtered by the ASIC to determine an ambient pressure (e.g. low frequency) and an acoustic pick-up (e.g., high frequency) using the same moving structure 120.

Figure 6:
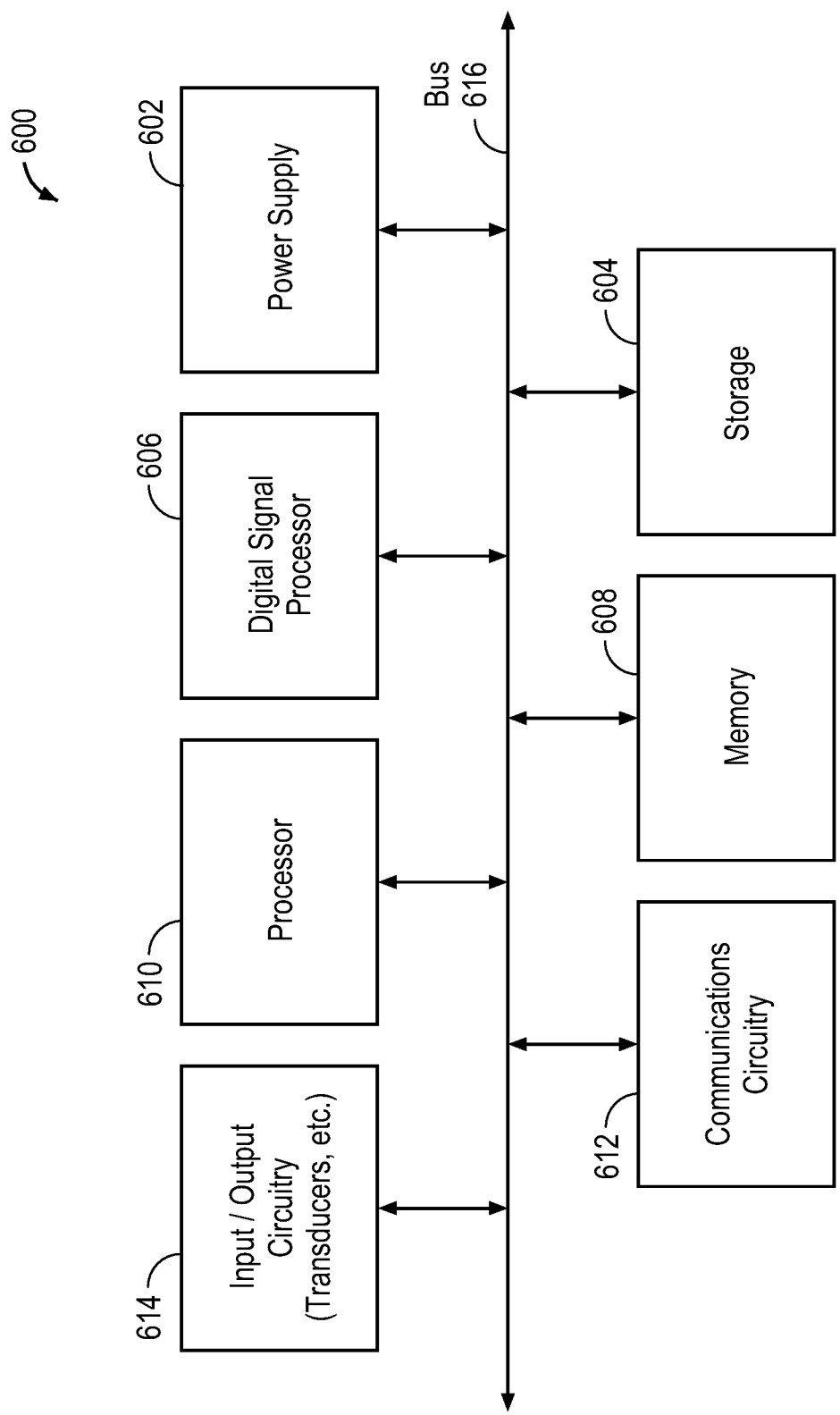
FIG. 6 illustrates a block diagram of some of the constituent components of an embodiment of an electronic device in which an embodiment of the invention may be implemented.

FIG. 6 illustrates a simplified schematic view of one embodiment of an electronic device in which an acoustic and ambient sensing element as described herein may be implemented. For example, a portable electronic device is an example of a system that can include some or all of the circuitry illustrated by electronic device 600.

Electronic device 600 can include, for example, power supply 602, storage 604, signal processor 606, memory 608, processor 610, communication circuitry 612, and input/output circuitry 614. In some embodiments, electronic device 600 can include more than one of each component of circuitry, but for the sake of simplicity, only one of each is shown in FIG. 6. In addition, one skilled in the art would appreciate that the functionality of certain components can be combined or omitted and that additional or less components, which are not shown in FIGS. 1-5, can be included in, for example, the portable device.

Power supply 602 can provide power to the components of electronic device 600. In some embodiments, power supply 602 can be coupled to a power grid such as, for example, a wall outlet. In some embodiments, power supply 602 can include one or more batteries for providing power to an ear cup, headphone or other type of electronic device associated with the headphone. As another example, power supply 602 can be configured to generate power from a natural source (e.g., solar power using solar cells).

Storage 604 can include, for example, a hard-drive, flash memory, cache, ROM, and/or RAM. Additionally, storage 604 can be local to and/or remote from electronic device 600. For example, storage 604 can include integrated storage medium, removable storage medium, storage space on a remote server, wireless storage medium, or any combination thereof. Furthermore, storage 604 can store data such as, for example, system data, user profile data, and any other relevant data.

Signal processor 606 can be, for example a digital signal processor, used for real-time processing of digital signals that are converted from analog signals by, for example, input/output circuitry 614. After processing of the digital signals has been completed, the digital signals could then be converted back into analog signals.

Memory 608 can include any form of temporary memory such as RAM, buffers, and/or cache. Memory 608 can also be used for storing data used to operate electronic device applications (e.g., operation system instructions).

In addition to signal processor 606, electronic device 600 can additionally contain general processor 610. Processor 610 can be capable of interpreting system instructions and processing data. For example, processor 610 can be capable of executing instructions or programs such as system applications, firmware applications, and/or any other application. Additionally, processor 610 has the capability to execute instructions in order to communicate with any or all of the components of electronic device 600. For example, processor 610 can execute instructions stored in memory 608 to enable or disable ANC.

Communication circuitry 612 may be any suitable communications circuitry operative to initiate a communications request, connect to a communications network, and/or to transmit communications data to one or more servers or devices within the communications network. For example, communications circuitry 612 may support one or more of Wi-Fi (e.g., a 802.11 protocol), Bluetooth®, high frequency systems, infrared, GSM, GSM plus EDGE, CDMA, or any other communication protocol and/or any combination thereof.

Input/output circuitry 614 can convert (and encode/decode, if necessary) analog signals and other signals (e.g., physical contact inputs, physical movements, analog audio signals, etc.) into digital data. Input/output circuitry 614 can also convert digital data into any other type of signal. The digital data can be provided to and received from processor 610, storage 604, memory 608, signal processor 606, or any other component of electronic device 600. Input/output circuitry 614 can be used to interface with any suitable input or output devices, such as, for example, microphone, speakers of the like. Furthermore, electronic device 600 can include specialized input circuitry associated with input devices such as, for example, one or more proximity sensors, accelerometers, etc. Electronic device 600 can also include specialized output circuitry associated with output devices such as, for example, one or more speakers, earphones, etc.

Lastly, bus 616 can provide a data transfer path for transferring data to, from, or between processor 610, storage 604, memory 608, communications circuitry 612, and any other component included in electronic device 500.

Although bus 616 is illustrated as a single component in FIG. 6, one skilled in the art would appreciate that electronic device 600 may include one or more components.

While certain exemplary embodiments have been described and shown in the accompanying drawings, it is to be understood that such embodiments are merely illustrative of and not restrictive on the broad invention, and that this invention is not limited to the specific constructions and arrangements shown and described, since various other modifications may occur to those of ordinary skill in the art. The description is thus to be regarded as illustrative instead of limiting.

What is claimed is:

1. A microelectromechanical system (MEMS) ambient pressure and acoustic sensor comprising:
    an enclosure having an enclosure wall that defines an interior chamber and an acoustic input opening to the interior chamber;
    a moving structure positioned within the interior chamber and being acoustically coupled to the acoustic input opening by a front volume chamber, the moving structure having an acoustic sensing portion that is movable in response to an acoustic pressure input and an ambient pressure sensing portion that is a different portion of the moving structure than the acoustic sensing portion and movable in response to an ambient pressure input, and wherein a side of the acoustic sensing portion and the ambient pressure sensing portion faces the acoustic input opening and defines at least a portion of the front volume chamber; and
    a circuit electrically coupled to the moving structure, the circuit operable to determine an acoustic output and an ambient pressure output based on a movement of the moving structure.

2. The MEMS ambient pressure and acoustic sensor of claim 1 wherein the acoustic sensing portion is more compliant than the ambient pressure sensing portion.

3. The MEMS ambient pressure and acoustic sensor of claim 1 wherein the acoustic sensing portion is radially inward to the ambient pressure sensing portion.

4. The MEMS ambient pressure and acoustic sensor of claim 1 wherein the acoustic sensing portion comprises a solid membrane and the ambient pressure sensing portion comprises a plurality of spokes extending radially outward from the solid membrane.

5. The MEMS ambient pressure and acoustic sensor of claim 1 wherein the acoustic sensing portion comprises a compliant member positioned between a first plate and a second plate, and wherein the first plate and the second plate are fixed with respect to the compliant member.

6. The MEMS ambient pressure and acoustic sensor of claim 1 wherein the ambient pressure sensing portion comprises a piezoelectric resistor.

7. The MEMS ambient pressure and acoustic sensor of claim 1 wherein the acoustic pressure input corresponds to a pressure change of 100 Pascal or less.

8. The MEMS ambient pressure and acoustic sensor of claim 1 wherein the ambient pressure input corresponds to a pressure change that is greater than 100 Kilopascal.

9. The MEMS ambient pressure and acoustic sensor of claim 1 wherein the circuit is operable to determine the acoustic output based on a change in capacitance caused by a movement of the acoustic sensing portion with respect to a fixed back plate within the enclosure.

10. The MEMS ambient pressure and acoustic sensor of claim 1 wherein the circuit is operable to determine the ambient pressure output based on a change in capacitance caused by a movement of the ambient pressure sensing portion with respect to a fixed back plate within the enclosure.

11. The MEMS ambient pressure and acoustic sensor of claim 1 wherein the circuit is operable to determine the ambient pressure output based on a change in resistance of the ambient pressure sensing portion caused by a movement of the ambient pressure sensing portion in response to the ambient pressure input.

12. The MEMS ambient pressure and acoustic sensor of claim 1 wherein the circuit is operable to filter a signal corresponding to a movement of the moving structure to determine the acoustic output and the ambient pressure output.

13. The MEMS ambient pressure and acoustic sensor of claim 1 wherein the ambient pressure sensing portion comprises a first movable plate and the acoustic sensing portion comprises a second movable plate, the first movable plate and the second movable plate share a sealed volume in between, and at least one of the ambient pressure output or the acoustic output is determined based on a change in pressure within the sealed volume.

14. A microelectromechanical system (MEMS) ambient pressure and acoustic sensor comprising:
   an enclosure having an enclosure wall that defines an interior chamber and an acoustic port to the interior chamber;
   a moving structure positioned within the interior chamber and being acoustically coupled to the acoustic input opening, the moving structure having a diaphragm portion and a piezoelectric portion extending radially outward from the diaphragm portion, and the diaphragm portion is movable in response to an acoustic pressure input and the piezoelectric portion is movable in response to an ambient pressure input; and
   a circuit electrically coupled to the moving structure to detect a movement of the moving structure for acoustic sensing and ambient pressure sensing.

15. The MEMS ambient pressure and acoustic sensor of claim 14 wherein the piezoelectric portion comprises a plurality of spokes, and each of the spokes comprise a piezoelectric resistor.

16. The MEMS ambient pressure and acoustic sensor of claim 15 wherein the pressure sensing comprises detecting a change in a resistance of the piezoelectric resistor.

17. The MEMS ambient pressure and acoustic sensor of claim 14 wherein the acoustic sensing comprises detecting a change in capacitance caused by a movement of the diaphragm portion with respect to a fixed plate within the enclosure.

18. The MEMS ambient pressure and acoustic sensor of claim 14 wherein the acoustic pressure input corresponds to a pressure change of 50 Millipascal to 100 Pascal.

19. The MEMS ambient pressure and acoustic sensor of claim 14 wherein the ambient pressure input corresponds to a pressure change of 100 Pascal to 110 Kilopascal.

20. A microelectromechanical system (MEMS) ambient pressure and acoustic sensor comprising:
   an enclosure having an enclosure wall that defines an interior chamber and an acoustic input opening to the interior chamber;
   a moving structure positioned within the interior chamber and acoustically coupled to the acoustic input opening, the moving structure having an acoustic sensing portion comprising a compliant member positioned between a first plate and a second plate, the compliant member being movable with respect to the first plate and the second plate, and an ambient pressure sensing portion extending radially outward from the acoustic sensing portion, the ambient pressure sensing portion being movable with respect to the enclosure; and
   a circuit electrically coupled to the moving structure to detect an acoustic pressure input and an ambient pressure input based on a movement of the moving structure.

21. The MEMS ambient pressure and acoustic sensor of claim 20 wherein the compliant member comprises a diaphragm that vibrates in response to an acoustic input.

22. The MEMS ambient pressure and acoustic sensor of claim 20 wherein the compliant member comprises a deformable polymer that deforms in response to an acoustic input.

23. The MEMS ambient pressure and acoustic sensor of claim 20 wherein the ambient pressure sensing portion remains in a fixed position when the compliant member moves in response to an acoustic pressure input.

24. The MEMS ambient pressure and acoustic sensor of claim 20 wherein the compliant member is movable in response to a pressure change corresponding to a high frequency input of 20 Hz or more.

25. The MEMS ambient pressure and acoustic sensor of claim 20 wherein the compliant member is movable in response to a pressure change corresponding to a low frequency input of 10 Hz or less.

* * * * *